United States Patent
Oguz et al.

(10) Patent No.: US 10,522,739 B2
(45) Date of Patent: Dec. 31, 2019

(54) PERPENDICULAR MAGNETIC MEMORY WITH REDUCED SWITCHING CURRENT

(71) Applicant: Intel Corporation, Santa Clara, CA (US)

(72) Inventors: Kaan Oguz, Beaverton, OR (US);
Kevin P. O'Brien, Portland, OR (US);
Brian S. Doyle, Portland, OR (US);
David L. Kencke, Beaverton, OR (US);
Charles C. Kuo, Hillsboro, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/735,616

(22) PCT Filed: Jun. 26, 2015

(86) PCT No.: PCT/US2015/037945
§ 371 (c)(1),
(2) Date: Jan. 8, 2018

(87) PCT Pub. No.: WO2016/209257
PCT Pub. Date: Dec. 29, 2016

(65) Prior Publication Data
US 2018/0301619 A1    Oct. 18, 2018

(51) Int. Cl.
*H01L 27/22*    (2006.01)
*H01L 43/08*    (2006.01)
(Continued)

(52) U.S. Cl.
CPC ............ *H01L 43/02* (2013.01); *H01L 27/222* (2013.01); *H01L 27/228* (2013.01); *H01L 43/08* (2013.01); *H01L 43/10* (2013.01)

(58) Field of Classification Search
CPC ......... H01L 43/02; H01L 43/10; H01L 43/08; H01L 27/228; G11C 11/00; G11C 11/161; G11C 2211/5615
See application file for complete search history.

(56) References Cited

U.S. PATENT DOCUMENTS

| | | |
|---|---|---|
| 7,342,277 B2 | 3/2008 | Radosavlijevic et al. |
| 7,608,883 B2 | 10/2009 | Radosavlijevic et al. |

(Continued)

FOREIGN PATENT DOCUMENTS

| | | |
|---|---|---|
| CN | 104009154 A | 8/2014 |
| JP | 2005036293 A | 2/2005 |
| WO | 2013095336 | 6/2013 |

OTHER PUBLICATIONS

European Patent Office, European Search Report dated Jan. 29, 2019 in European Patent Application No. 15896543.4, 10 pages.

(Continued)

*Primary Examiner* — Galina G Yushina
(74) *Attorney, Agent, or Firm* — Trop, Pruner & Hu, P.C.

(57) ABSTRACT

An embodiment includes an apparatus comprising: a substrate; and a perpendicular magnetic tunnel junction (pMTJ) comprising a fixed layer and first and second free layers; wherein (a) the first free layer includes Cobalt (Co), Iron (Fe), and Boron (B), and (b) the second free layer is epitaxial and includes Manganese (Mn) and Gallium (Ga). Other embodiments are described herein.

18 Claims, 5 Drawing Sheets

(51) Int. Cl.
*H01L 43/10* (2006.01)
*H01L 43/02* (2006.01)

(56) References Cited

U.S. PATENT DOCUMENTS

| | | | |
|---|---|---|---|
| 8,786,040 | B2 | 7/2014 | Doyle et al. |
| 9,337,415 | B1* | 5/2016 | Oh .......................... H01L 43/08 |
| 2004/0061983 | A1 | 4/2004 | Childress et al. |
| 2007/0086121 | A1 | 4/2007 | Nagase et al. |
| 2008/0088980 | A1 | 4/2008 | Kitagawa et al. |
| 2008/0094886 | A1 | 4/2008 | Ranjan et al. |
| 2008/0113220 | A1 | 5/2008 | Sun et al. |
| 2008/0225585 | A1 | 9/2008 | Ranjan et al. |
| 2009/0065883 | A1 | 3/2009 | Wang et al. |
| 2009/0261433 | A1 | 10/2009 | Kang et al. |
| 2010/0320550 | A1 | 12/2010 | Abraham et al. |
| 2011/0031569 | A1 | 2/2011 | Watts et al. |
| 2011/0044096 | A1 | 2/2011 | Li |
| 2011/0062537 | A1 | 3/2011 | Oh et al. |
| 2011/0064969 | A1* | 3/2011 | Chen ...................... B82Y 25/00 428/800 |
| 2011/0221016 | A1* | 9/2011 | Zheng ...................... G11C 11/16 257/421 |
| 2011/0303997 | A1 | 12/2011 | Wang et al. |
| 2012/0299635 | A1 | 11/2012 | Worledge et al. |
| 2013/0005052 | A1 | 1/2013 | Hu et al. |
| 2013/0134534 | A1 | 5/2013 | Sbiaa et al. |
| 2013/0201757 | A1 | 8/2013 | Li et al. |
| 2013/0249028 | A1 | 9/2013 | Kamata et al. |
| 2014/0015078 | A1 | 1/2014 | Huai et al. |
| 2014/0092677 | A1 | 4/2014 | Karpov et al. |
| 2014/0175575 | A1 | 6/2014 | Doyle et al. |
| 2014/0252515 | A1* | 9/2014 | Lai .......................... H01L 43/12 257/421 |
| 2015/0008547 | A1 | 1/2015 | Pi et al. |
| 2015/0091110 | A1 | 4/2015 | Kuo et al. |
| 2015/0162378 | A1 | 6/2015 | Carey et al. |

OTHER PUBLICATIONS

Kurt, et al. "Exchange-based magnetic tunnel junctions with antiferromagnetic ε-Mn3Ga", Applied Physics Letters, Dec. 3, 2012, four pages, vol. 101, American Institute of Physics.

The International Searching Authority, "Written Opinion of the International Searching Authority and the International Search Report" dated Mar. 25, 2016 in International Application No. PCT/US2015/037945.

U.S. Appl. No. 14/039,668, filed Sep. 27, 2013 and titled "Perpendicular Spin Transfer Torque Memory (STTM) Device With Coupled Free Magnetic Layers," by Charles C. Kuo et al.

International Search Report and Written Opinion of the International Searching Authority for PCT/US2014/053723, dated Dec. 8, 2014, 10 pages.

Taiwanese Patent Office, Office Action dated Nov. 4, 2019 in Taiwanese patent application No. 105115993, 3 pages.

* cited by examiner

US 10,522,739 B2

PERPENDICULAR MAGNETIC MEMORY WITH REDUCED SWITCHING CURRENT

TECHNICAL FIELD

Embodiments of the invention are in the field of semiconductor devices and, in particular, magnetic memory.

BACKGROUND

As described in U.S. Patent Application Publication 2015/0091110, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque. If a current is passed through a magnetization layer, called the fixed magnetic layer, the current output from the magnetization layer will be spin polarized. With the passing of each electron, its spin (angular momentum) will be transferred to the magnetization in the next magnetic layer, called the free magnetic layer, and will cause a small change on its magnetization. This is, in effect, a torque-causing precession of magnetization. Due to reflection of electrons, a torque is also exerted on the magnetization of an associated fixed magnetic layer. In the end, if the current exceeds a certain critical value (which is a function of damping caused by the magnetic material and its environment), the magnetization of the free magnetic layer will be switched by a pulse of current, typically in about 1-10 nanoseconds. Magnetization of the fixed magnetic layer may remain unchanged since an associated current is below its threshold due to geometry or due to the adjacent hard magnetic layers.

Spin-transfer torque can be used to flip the active elements in magnetic random access memory. Spin-transfer torque memory (STTM) has the advantages of lower power consumption and better scalability over conventional magnetic random access memory (MRAM) which uses magnetic fields to flip the active elements.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
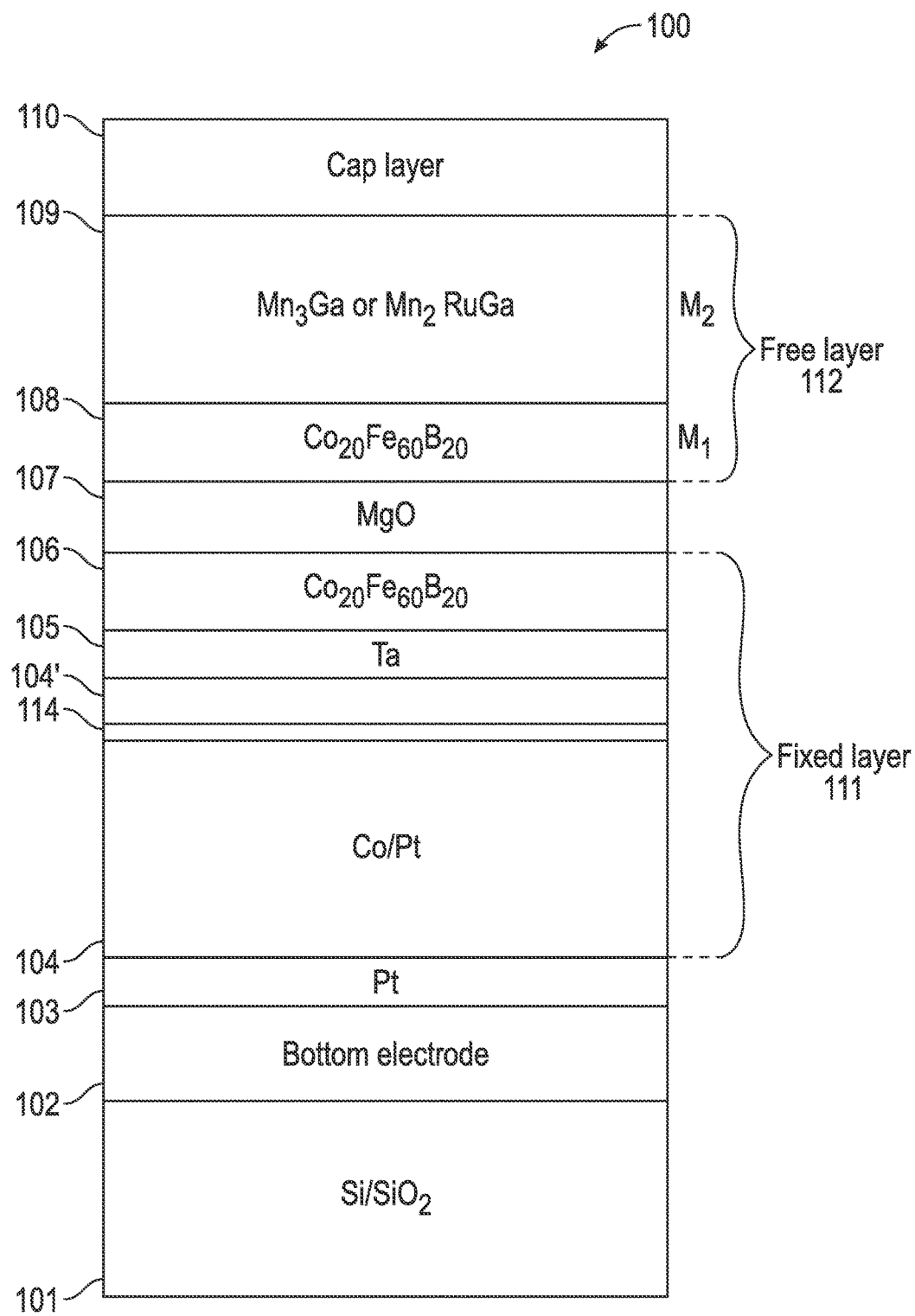
FIG. 1 includes a STTM stack in an embodiment of the invention.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As described above, STTM has low power consumption and good scalability over conventional MRAM. However, STTMs can suffer from poor stability when aggressively scaled. Stability is one of the most important issues facing scaling of STTM based devices and memory arrays fabricated there from. As scaling continues, the need for smaller memory elements to fit into a scaled cell size has driven the industry in the direction of perpendicular STTMs, which have higher stability for small memory element sizes. Common perpendicular STTMs are achieved with a material layer stack that includes a bottom electrode, a fixed magnetic layer, a dielectric layer (e.g., MgO), a free magnetic layer (e.g., CoFeB), a capping layer (e.g., Ta), and a top electrode. A magnetic tunnel junction (MTJ) portion of the material layer stack includes the fixed magnetic layer, the dielectric layer, and the free magnetic layer. This material stack is a basic material stack for fabricating STTM, and may be fabricated with greater complexity. For example, an antiferromagnetic layer may also be included between bottom electrode and fixed magnetic layer. Additionally, electrodes may themselves include multiple layers of material with differing properties. The material stack may, in its most basic form, be an in-plane system, where spins of the magnetic layers are in a same plane as the layers themselves. However, with layer or interface engineering, the material stack may be fabricated to provide a perpendicular spin system. In an example, a free magnetic layer (e.g., a free magnetic layer composed of CoFeB) is thinned down from a conventional thickness used for in-plane STTM devices. The extent of thinning may be sufficient such that a perpendicular component obtained from the iron/cobalt (Fe/Co) in the free magnetic layer interacting with oxygen in the dielectric layer (e.g., interacting with a magnesium oxide (MgO) layer) dominates over the in-plane component of the free CoFeB layer. This example provides a perpendicular system based on a single layer system of coupling to one interface of the free layer (i.e., the CoFeB—MgO interface). The degree of oxidation of surface iron/cobalt atoms (Fe/Co) in the CoFeB layer by oxygen from the MgO layer provides the strength (stability) of the free layer to have perpendicular-dominated spin states.

The conventional stack described above fails to provide high stability and low damping. Stability is defined as the energy barrier between two magnetic states (e.g., (1, 0), (parallel, anti-parallel)). Stability is equal to the product of effective magnetic anisotropy, thickness of free magnetic layer, and area of free magnetic layer. Damping relates to a magnetic friction that the magnetization experiences as it switches from one state to another. A larger damping means that a larger write current is needed because the magnetic damping opposes the spin transfer torque. However, for the conventional material stack described above with a single free magnetic layer (e.g., CoFeB film), damping increases as CoFeB thickness in nanometers (nm) decreases due to spin pumping effects. Thus, for higher stability that is represented by thinner CoFeB, the conventional material stack provides higher damping that results in a higher switching current.

A perpendicular STTM uses a perpendicular MTJ (pMTJ) as a memory element. Applicant determined scalability of a pMTJ is a problem below 30 nm critical dimension (CD). For example, the thermal stability of the free layer drops significantly as the junction diameter decreases. A desired thermal stability or industry standard, such as 60 kT or higher, may be required for commercial viability of any pMTJ memory device.

Several conventional solutions to promote stability were addressed above. An additional conventional solution to the low stability STTM problem is to use high anisotropy anchor materials like Co/Pt or Co/Pd. However, these materials have high damping values (~0.1), which results in a critical current density (Jc) ("write current") that is generally high. For example, a conventional pMTJ stack may have a high stability (e.g., 273 kT at 25 nm CD) but there may be no observable current switching for such a stack due to high damping in the free layer. This may be expected considering Jc is given by the equation;

$$J_{c0} = \frac{1}{\eta} \frac{2\alpha e}{\hbar} (M_S t) H_K.$$

where $H_K$ is the anisotropy field, $\eta$ is the spin transfer efficiency, $\alpha$ is magnetic damping, e is electronic charge, $M_s$ is the saturation magnetization of the free layer, h is Planks' constant, and t is the thickness of the free layer.

In other words, conventionally the increase in stability for the free layer is obtained by increasing the perpendicular magnetic anisotropy of the magnetic material. This increase in anisotropy also increases the critical current density linearly. As a result, the write current required to write a memory state to a pMTJ increases.

To solve the high Jc problem of the prior art, an embodiment includes a high anisotropy, low damping free layer material included in an "anchor" layer (also referred to herein as a second or additional free layer). These materials include Manganese (Mn), Gallium (Ga), and Ruthenium (Ru) in various combinations and stoichiometric ratios. Some examples include $Mn_2Ru_xGa$, $Mn_2Ga$, $Mn_3Ga$, $Mn_{2-x}Ga_x$ and their alloys. Embodiment have shown stability greater than 80 kT with a CD=22 nm. Thus, while a conventional high anisotropy, high damping anchor material (e.g., Co and/or Pt) shows increased stability, that stability comes with increased Jc. However, an embodiment has at least 10× lower damping than such a device and shows the same stability with about 2× lower Jc.

Thus, one or more embodiments are directed to increasing stability (e.g., thermal stability or the ability to maintain a memory state at expected operating temperatures) for the free layer of a perpendicular magnetic tunnel junction MTJ (pMTJ) and reducing damping or maintaining a low damping in pMTJ based devices. Such devices include, for example, perpendicular STTM systems. Applications may include use of MTJs in embedded memory, embedded non-volatile memory (NVM), magnetic random access memory (MRAM), NVM, and non-embedded or stand-alone memories. Embodiments are applicable to both MTJ and pMTJ based stacks.

Such embodiments address the problematic increase in write current brought on by efforts to increase stability. For example, an embodiment includes a novel free layer structure that uses a novel high anisotropy, low damping magnetic material to increase the free layer thermal stability without significantly increasing the critical current density (Jc). An embodiment includes a pMTJ free layer that comprises $Mn_2Ru_xGa$ (x=0.2-1.0), $Mn_3Ga$, and other alloys that include Mn and Ga in varying proportions to each other and with varying additional elements (e.g., Ru) in the alloys. Embodiments with Mn and Ga free layer compositions have extremely low damping with high anisotropy, all of which achieves high stability and low Jc (e.g., ≤30 nm current density (CD)).

FIG. 1 includes a STTM stack in an embodiment of the invention. Stack 100 includes a fixed layer that comprises multiple sublayers. The fixed layer is on substrate 101, which may include Silicon (Si), SiGe, and the like. Substrate 101 may include a patterned metal pad (e.g., Cu, Ru, Ta, Co and alloys of thereof). Substrate 101 may include a semi-conductor on insulator (SOI) substrate. The insulator may include $SiO_2$ or the like. In an embodiment layer 101 has a height or thickness of 100 nm. "Thickness" or "height" as used herein is shown in FIG. 1 in the vertical direction, whereas "width" would be in the horizontal direction of FIG. 1. Bottom electrode 102 is on "top" of layer 101. In an embodiment layer 103, including platinum (Pt), is on layer 102. Layer 103 may be 5 nm in some embodiments.

Fixed layer 111 is part of a pMTJ and includes sublayers 104, 104', 114, 105, 106. Layer 104 includes alternating Co and Pt sublayers as described regarding the embodiment of FIG. 3. Layer 114 may be included in some embodiments and include Ru. Layer 114 may be used to form a synthetic antiferromagnetic structure to reduce magnetic stray fields acting on the free layer. Layer 114 thickness can be vary between 0.3-2.0 nm in various embodiments. Stray fields may cause devices to operate asymmetrically with respect to current. Layer 104' may include one or more Co sublayers alternating with one or more Pt sublayers. The number of Co/Pt layers in layer 104' are adjusted to counter-balance the stray field created by layer 104.

In some embodiments barrier layer 105 is on layer 104'. Layer 105 may include Tantalum (Ta), tungsten (W), molybdenum (Mo), hafnium (Hf), vanadium (V), zirconium (Zr) and alloys thereof and may be 0.1-0.8 nm thick. Layer 105 may include sublayers. Sublayers can be trilayers comprising nonmagnetic metal/magnetic metal (Co, Fe, CoFeB, Ni, NiFe, CoFe and alloys thereof)/non-magnetic metal combinations. The nonmagnetic metal may be similar to layer 105 materials and alloys. Thickness of the sublayers may be 0.1-1.0 nm. Layer 106 includes CoFeB in varying combinations such as, for example, $Co_{20}Fe_{60}B_{20}$. Layer 106 may be 0.8-1.8 nm thick in some embodiments. Dielectric layer 107 is between fixed layer 111 and free layer 112. Layer 107 may include MgO and may be 0.8-1.5 nm thick. Free layer 112 may include sublayers such as layers 108, 109. Layer 108 includes CoFeB in varying combinations such as, for example, $Co_{20}Fe_{60}B_{20}$ and may be 0.8-3.0 nm thick in some embodiments. This "M1" layer is the first magnet layer of free layer 112. Layer 109, an "anchor" layer, may include $Mn_2RuGa$ in some embodiments or $Mn_3Ga$ in others. Still other embodiments may include other alloys or combinations of elements that include both Mn and Ga in some capacity. The Mn and Ga help deliver stability while maintaining damping (which maintains acceptable write current values). This "M2" layer is the second magnet layer of free layer 112. Cap layer 110 is on free layer 112. Layer 110 may include Ta, Ti, W, Mo, V, Cu and/or Ru.

Figure 2:
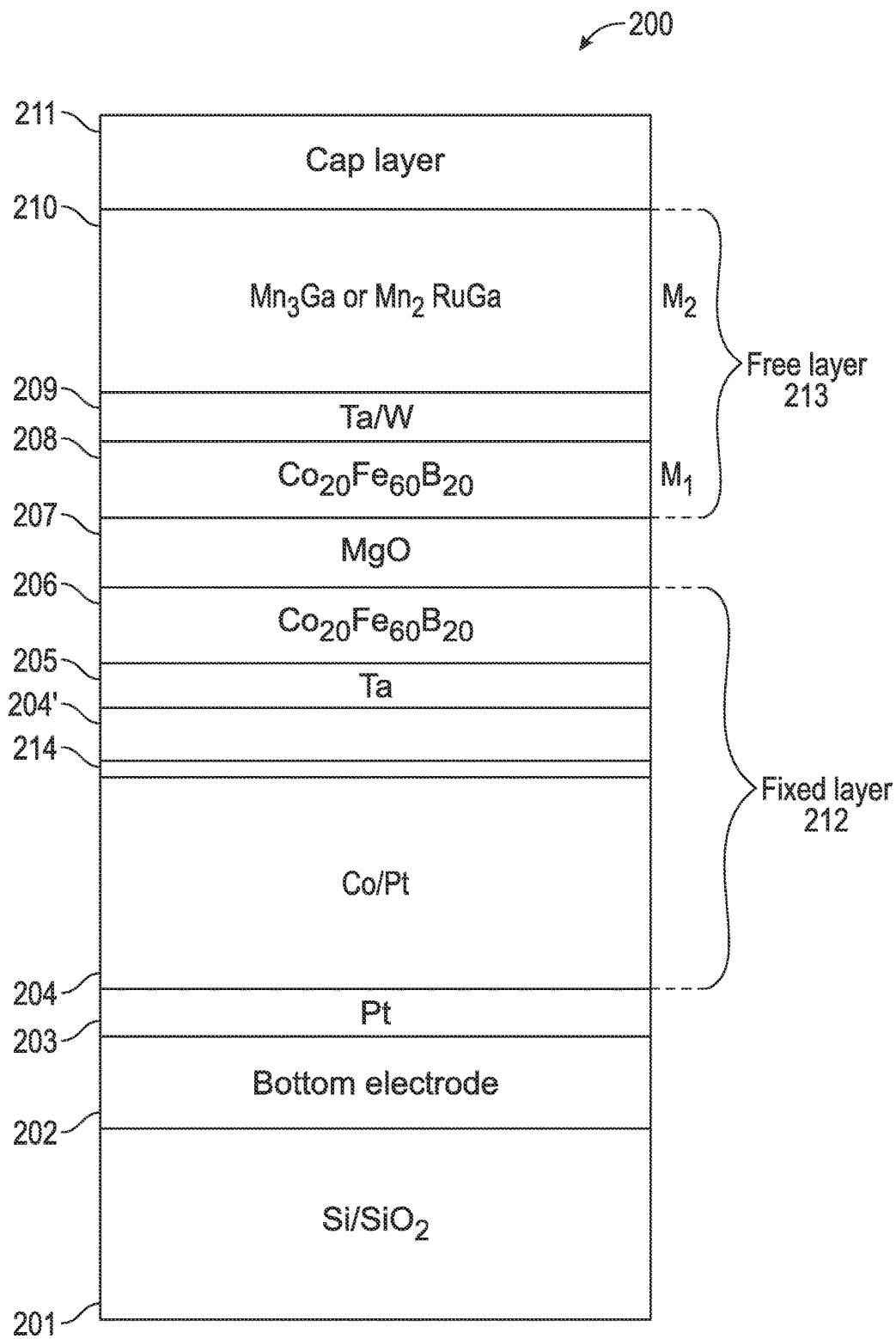
FIG. 2 includes a STTM stack in an embodiment of the invention. Stack 200 includes a diffusion/crystal barrier layer 209.

FIG. 2 includes a STTM stack in an embodiment of the invention. Stack 200 includes a diffusion/crystal barrier layer 209. In an embodiment layer 209 has the same properties as layer 105 (described above with regard to FIG. 1). Stack 200 includes a fixed layer that comprises multiple sublayers. The fixed layer is on substrate 201, which may include Si, $SiO_2$, SiGe, and the like. In an embodiment layer 201 has a height or thickness of 100 nm. Substrate 201 may include a patterned metal pad (e.g., Cu, Ru, Ta, Co and alloys thereof). Bottom electrode 202 is on "top" of layer 201. In an embodiment layer 203, including Pt, is on layer 202. Layer 203 may be 5 nm in some embodiments. Fixed layer 212 is part of a pMTJ and includes sublayers 204, 204', 214, 205, 206. Layer 212 and its sublayers may have similar materials and dimensions to layer 111 of FIG. 1 and the sublayers of layer 111. Layer 204 includes alternating Co and Pt sublayers as described regarding the embodiment of FIG. 3. Layer 214 may be included in some embodiments and include Ru. Layer 204' may include one or more Co sublayers alternating with one or more Pt sublayers. In some embodiments barrier layer 205 is on layer 204'. Layer 205 may include Ta and be 0.3 nm thick. Layer 206 includes CoFeB in varying combinations such as, for example, $CO_{20}Fe_{60}B_{20}$. Layer 206 may be 1 nm thick in some embodiments. Dielectric layer 207 is between fixed layer 212 and free layer 213. Layer 207 may include MgO and may be 1 nm thick. Free layer 213 may include sublayers such as layers 208, 209, 210. Layer 208 includes CoFeB in varying combinations such as, for example, $Co_{20}Fe_{60}B_{20}$ and may be 1.5 nm thick in some embodiments. Diffusion/crystal barrier layer 209 helps limit migration (e.g., migration of Mn during annealing of finished stack) to or from layer 210. Layer 209 may include Tantalum (Ta), Tungsten (W), and/or Chromium (Cr) and the like. Layer 210, an "anchor" layer, may include $Mn_2RuGa$ in some embodiments or $Mn_3Ga$ in others. Still other embodiments may include other alloys or combinations of elements that include both Mn and Ga in some capacity. The Mn and Ga help deliver stability while maintaining damping (which maintains acceptable write current values). Cap layer 210 is on free layer 212.

Figure 3:
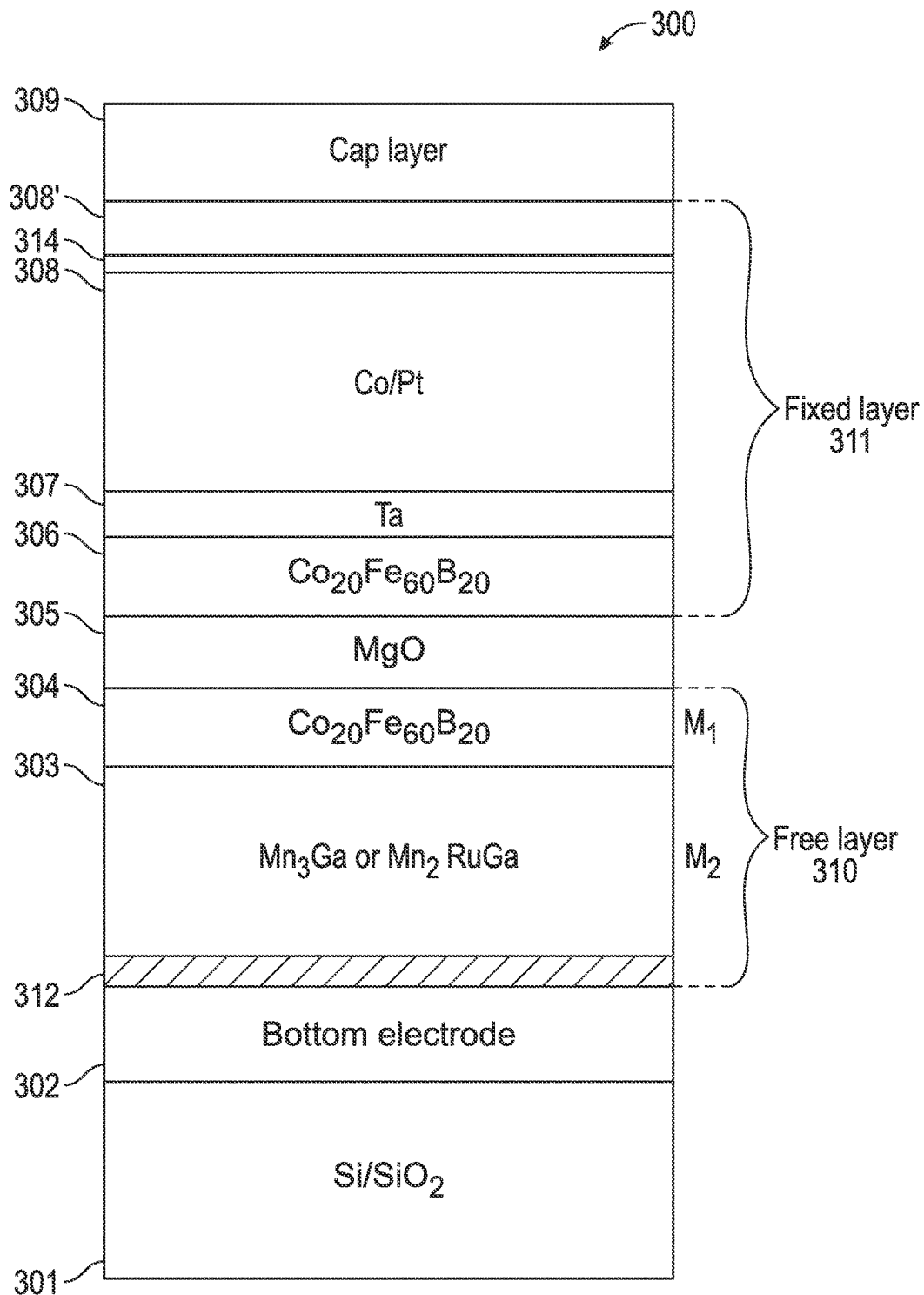
FIG. 3 includes a "reverse" STTM stack in an embodiment of the invention. Stack 300 does not include a diffusion/crystal barrier layer between free layers 303, 304.

FIG. 3 includes a "reverse" STTM stack in an embodiment of the invention. Stack 300 does not include a diffusion/crystal barrier layer between free layers 303, 304. Stack 300 includes a fixed layer that comprises multiple sublayers. The fixed layer is on substrate 301, which may include Si, $SiO_2$, SiGe, and the like. In an embodiment layer 301 has a height or thickness of 100 nm. Substrate 301 may include a patterned metal pad (e.g., Cu, Ru, Ta, Co and alloys thereof). Bottom electrode 302 is on "top" of layer 301. Fixed layer 311 is part of a pMTJ and includes sublayers 306, 307, 308, 308', 314.

Layer 308 includes sublayers of Co and Pt. The Co/Pt layers may be repeated 2-10 times in various embodiments (e.g., 5 Co layers alternating with 5 Pt layers), thereby forming 10 or more Co/Pt layers. The Co layers may have a thickness of 0.1-1 nm and the Pt layers may have a thickness of 0.1-1 nm. Layer 314 may be included in some embodiments and include Ru. Layer 314 may include the same materials and dimensions as 114 of FIG. 1. Layer 308' may include one or more Co sublayers alternating with one or more Pt sublayers.

In some embodiments barrier layer 307 is on layer 306. Layer 307 may include the same materials and dimensions as layer 105 of FIG. 1. Layer 307 may include Ta and be 0.3 nm thick. Layer 306 includes CoFeB in varying combinations such as, for example, $Co_{20}Fe_{60}B_{20}$. Layer 306 may be 1 nm thick in some embodiments. Dielectric layer 305 is between fixed layer 311 and free layer 310. Layer 305 may include MgO and may be 1 nm thick. Free layer 310 may include sublayers such as layers 312, 303, 304. Layer 304 includes CoFeB in varying combinations such as, for example, $Co_{20}Fe_{60}B_{20}$ and may be 1.5 nm thick in some embodiments. Layer 303, an "anchor" layer, may include $Mn_2RuGa$ in some embodiments or $Mn_3Ga$ in others. Still other embodiments may include other alloys or combinations of elements that include both Mn and Ga in some capacity. The Mn and Ga help deliver stability while maintaining damping (which maintains acceptable write current values). Layer 303 may range from 1-5 nm thickness in various embodiments.

Layer 312 is a crystal enhancing layer, sometimes referred to herein as a "seed layer" or "buffer layer". Seed layer 312 may include TiN, CrRu, and the like. Layer 312 may be highly textured to promote epitaxial growth of layer 303 considering without layer 312, there may difficulty growing layer 303 on a $SiO_2$ substrate (e.g., substrate 301). Thickness of seed layer 312 may be between 0-30 nm. Layer 312 helps promote epitaxial growth for layer 303. Layer 312 may be a buffer that helps set the epitaxial growth of layer 303. In contrast to epitaxial layer 303, first magnet layer 304 may be amorphous or polycrystalline. In an embodiment, dielectric layer 305 is non-epitaxial. Cap layer 309 is on fixed layer 311.

While FIGS. 1 and 2 did not include a crystal enhancing seed layer, they may be modified in other embodiments and include such a layer directly below and in contact with anchor free layers 109, 210.

As used herein, "epitaxial" indicates the epitaxial is a crystalline overlayer that has one well-defined orientation with respect to an underlying layer's crystal structure. In contrast, polycrystalline layers have crystals of varying size and orientation. Their orientation can be random with no preferred direction.

FIG. 3 is a "reverse stack" (with free layer 310 below fixed layer 311) that locates the anchor layer 303 directly on a crystal enhancing layer that promotes epitaxial growth for layer 303. This is possible while still maintaining direct contact with the first metal layer 304.

Figure 4:
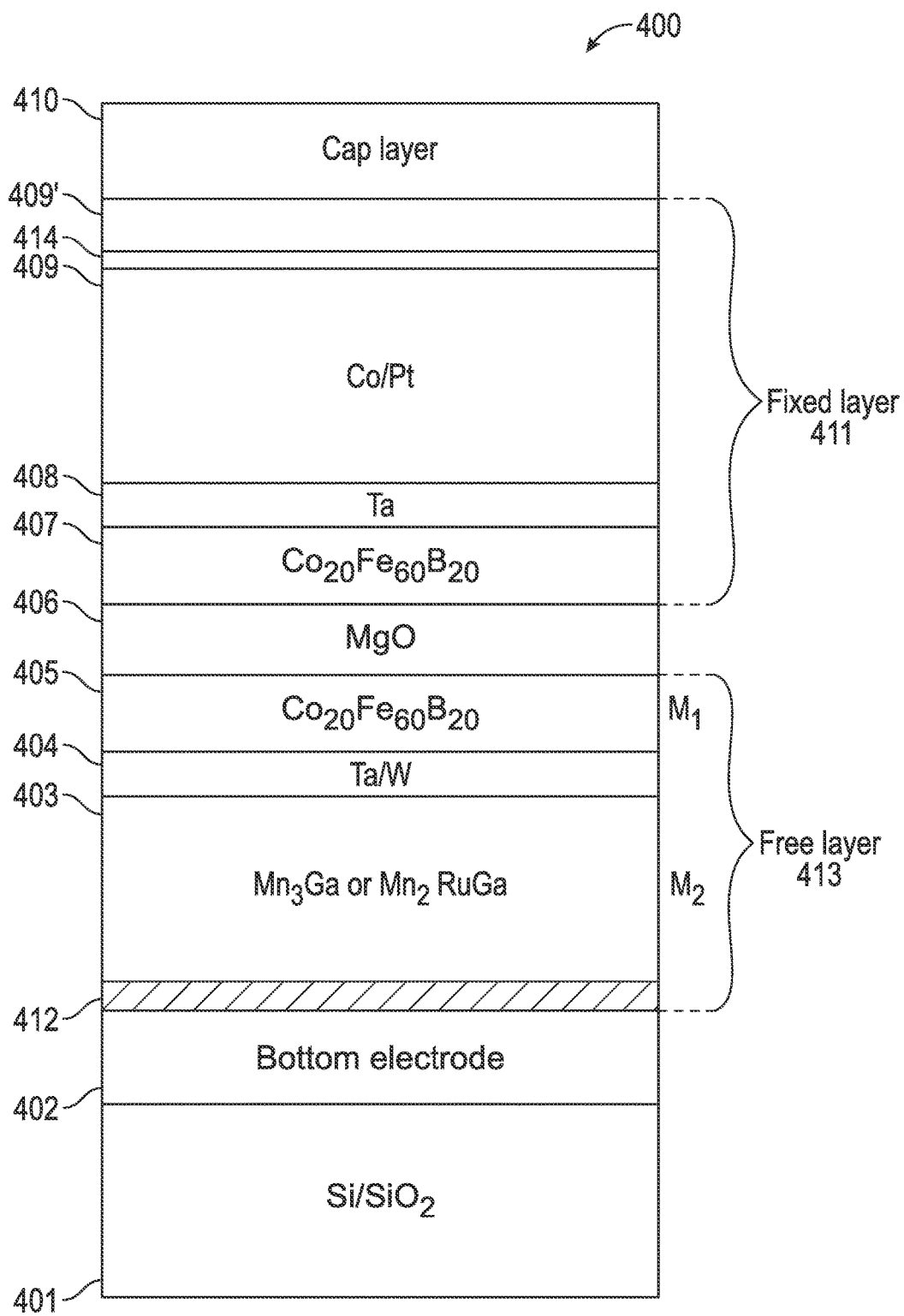
FIG. 4 includes a "reverse" STTM stack in an embodiment of the invention. Stack 400 includes a diffusion/crystal barrier layer 404 between free layers 403, 405.

FIG. 4 includes a "reverse" STTM stack in an embodiment of the invention. Stack 400 includes a diffusion/crystal barrier layer 404 between free layers 403, 405. Stack 400 includes a fixed layer that comprises multiple sublayers. The fixed layer is on substrate 401, which may include Si, SiO$_2$, SiGe, and the like. In an embodiment layer 401 has a height or thickness of 100 nm. Bottom electrode 402 is on "top" of layer 401. Fixed layer 411 is part of a pMTJ and includes sublayers 407, 408, 409, 409', 414. Layer 409 includes alternating Co and Pt sublayers as described regarding the embodiment of FIG. 3. Layer 414 may be included in some embodiments and include Ru. Layer 409' may include one or more Co sublayers alternating with one or more Pt sublayers. In some embodiments barrier layer 408 is on layer 407. Layer 408 may include Ta and be 0.3 nm thick. Layer 407 includes CoFeB in varying combinations such as, for example, Co$_{20}$Fe$_{60}$B$_{20}$. Layer 407 may be 1 nm thick in some embodiments. Dielectric layer 406 is between fixed layer 411 and free layer 413. Layer 406 may include MgO and may be 1 nm thick. Free layer 413 may include sublayers such as layers 412, 403, 404, 405. Layer 405 includes CoFeB in varying combinations such as, for example, Co$_{20}$Fe$_{60}$B$_{20}$ and may be 1.5 nm thick in some embodiments. Layer 403, an "anchor" layer, may include Mn$_2$RuGa in some embodiments or Mn$_3$Ga in others. Still other embodiments may include other alloys or combinations of elements that include both Mn and Ga in some capacity. The Mn and Ga help deliver stability while maintaining damping (which maintains acceptable write current values). Layer 412 is a seed layer including, for example, TiN, CrRu, and the like. Layer 412 helps promote epitaxial growth for layer 403. Layer 412 may be a seed/buffer layer that helps set the epitaxial growth of layer 403. In contrast to epitaxial layer 403, first magnet layer 405 may be non-epitaxial (i.e., amorphous or polycrystalline). In an embodiment, dielectric layer 406 is non-epitaxial. Diffusion/crystal structure barrier 404 may include Ta, W, and/or Cr and the like and help prevent element migration (e.g., Mn migration) to or from anchor layer 403. Layer 404 may include the same materials and dimensions as layer 105. Cap layer 410 is on fixed layer 411. Layer 404 may also be referred to as a "spacer layer" and my include sublayers of differing element compositions.

FIG. 4 is a "reverse stack" (with free layer 413 below fixed layer 411) that locates the anchor layer 403 directly on a crystal enhancing layer 412 that promotes epitaxial growth for layer 403. This is possible while still maintaining direct contact with the first metal layer 405.

In an embodiment, the stack is annealed after formation to promote proper tunnel magnetoresistance (TMR) of the stack's MTJ.

For brevity materials and dimensions for analogous layers are not always repeated. For example, layer 211 is analogous to layer 110 and may include similar materials and dimensions. Other analogous pairs of layers are as follows: 109/210, 108/208, 107/207, 106/206, 105/205, 104'/204', 114/214, 104/204, 103/203, 102/202, 101/201. Other analogous pairs of layers are as follows: 211/309, 204/308, 214/314, 204'/308', 205/307, 206/306, 207/305, 208/304, 210/303, 202/302, 201/301. Other analogous pairs of layers are as follows: 309/410, 308'/409', 314/414, 308/409, 307/408, 306/407, 305/406, 304/405, 303/403, 312/412, 302/402, 301/401.

Various embodiments disclosed herein have addressed MTJs in varying forms. Any such MTJ may be used in a memory cell by coupling one portion or node of the MTJ stack (e.g., a top electrode above the fixed layer 411 of FIG. 4) to a bit-line and another node of the MTJ stack (e.g., bottom electrode 402 of FIG. 4) to a source or drain node of a switching device, such as a selection transistor. The other of the source and drain node of the selection transistor may be coupled to a source line of the memory cell. The gate of the selection transistor may couple to a word-line. Such a memory cell may utilize TMR of the MTJ to store memory states. Embodiments provided herein provide an increase in stability for the memory state without a corresponding increase in damping and write current. Such embodiments subsequently provide more stable and power efficient memory cells that can be scaled below, for example, 22 nm CD. The STT memory cell may couple to a sense amplifier. A plurality of the STT memory bit cells may be operably connected to one another to form a memory array, wherein the memory array can be incorporated into a non-volatile memory device. It is to be understood that the selection transistor may be connected to the top electrode or the bottom electrode of a MTJ stack.

Figure 5:
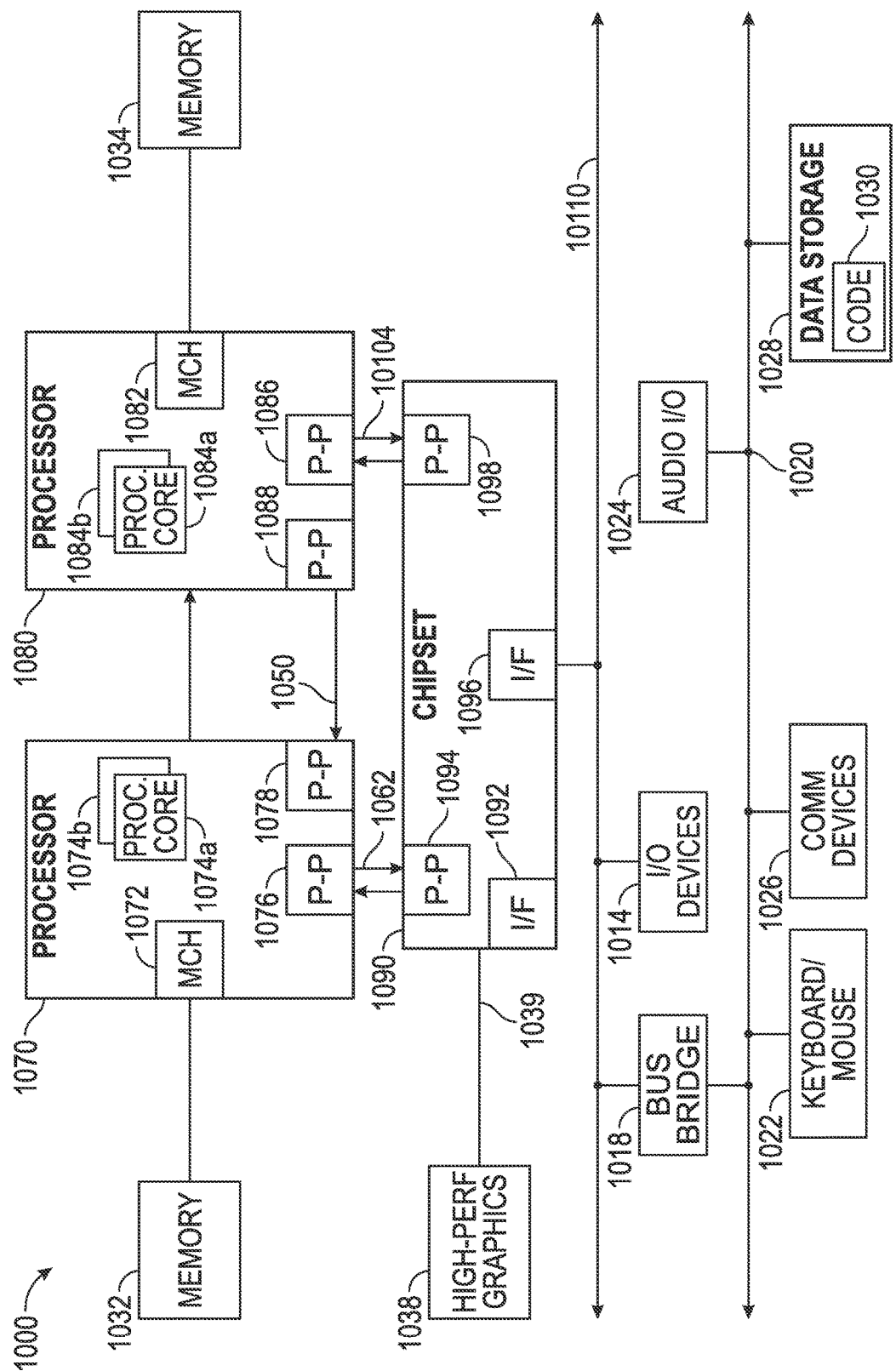
FIG. 5 includes a memory cell within which an embodiment of the invention is included.

FIG. 5 includes a system that may include above described memory cell. FIG. 5 includes a block diagram of a system embodiment 1000 in accordance with an embodiment of the present invention. System 1000 may include a mobile computing node such as a cellular phone, smartphone, tablet, Ultrabook®, notebook, laptop, personal digital assistant, and mobile processor based platform. System 1000 may include hundreds or thousands of the above described memory cells and be critical to memory functions in system 1000. The stability and power efficiency of such memory cells accumulates when the memory cells are deployed in mass and provides significant performance advantages (e.g., longer battery life, longer memory state storage in a broader range of operating temperatures) to such computing nodes.

Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074a and 1074b and processor cores 1084a and 1084b). Such cores 1074, 1074b, 1084a, 1084b may be configured to execute instruction code.

Each processing element 1070, 1080 may include at least one shared cache or memory unit which may include MTJs described herein. The shared cache may store data (e.g., instructions) that are utilized by one or more components of the processor, such as the cores 1074a, 1074b and 1084a, 1084b, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller logic (MC) 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. Memory 1032, 1024 may include MTJs/pMTJs described herein. While MC logic 1072 and 1082 is illustrated as integrated into the processing elements 1070, 1080, for alternative embodiments the MC logic may be discreet logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device which may include code 1030, in one embodiment. The code 1030 may include instructions for performing embodiments of one or more of the methods described above. Further, an audio I/O 1024 may be coupled to second bus 1020.

Note that other embodiments are contemplated. For example, instead of the point-to-point architecture shown, a system may implement a multi-drop bus or another such communication topology. Also, the elements of FIG. 5 may alternatively be partitioned using more or fewer integrated chips than shown in the FIG. 5. For example, a field programmable gate array may share a single wafer with a processor element and memory including MTJs described herein.

A communications module may include, for example, element 1026 of FIG. 4, a wireless radio interface, antennae, OFDM module, and the like.

Also, for brevity not every layer is always depicted in embodiments described herein. For example, FIG. 1 does not depict a top electrode even though one may be located on cap layer 110 in some embodiments.

As used herein, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric (e.g., MgO) or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the TMR effect while applying voltage to the output electrodes. In an embodiment, the role of the dielectric layer (e.g., dielectric layer 406) is to cause a large magneto-resistance ratio. The magneto-resistance is the ratio of the difference between resistances when the two ferromagnetic layers have anti-parallel magnetizations and the resistance of the state with the parallel magnetizations.

MTJs described herein function essentially as a resistor, where the resistance of an electrical path through the MTJ may exist in two resistive states, either "high" or "low," depending on the direction or orientation of magnetization in the free magnetic layers and in the fixed magnetic layer. In the case that the spin direction is down (minority) in the free magnetic layer, a high resistive state exists, wherein direction of magnetization in the coupled free magnetic layers and the fixed magnetic layer are substantially opposed or anti-parallel with one another. In the case that the spin direction is up (majority) in the coupled free magnetic layers, a low resistive state exists, wherein the direction of magnetization in the coupled free magnetic layers and the fixed magnetic layer is substantially aligned or parallel with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the coupled free magnetic layers may be switched through STT using a spin-polarized current. An electrical current is generally non-polarized (e.g. consisting of about 50% spin-up and about 50% spin-down electrons). A spin polarized current is one with a greater number of electrons of either spin-up or spin-down, which may be generated by passing a current through the fixed magnetic layer. The electrons of the spin polarized current from the fixed magnetic layer tunnel through the tunneling barrier or dielectric layer and transfers its spin angular momentum to the free magnetic layer, wherein the free magnetic layer will orient its magnetic direction from anti-parallel to that of the fixed magnetic layer or parallel. The free magnetic layer may be returned to its original orientation by reversing the current.

Thus, the MTJ may store a single bit of information ("0" or "1") by its state of magnetization. The information stored in the MTJ is sensed by driving a current through the MTJ. The free magnetic layer(s) does not require power to retain its magnetic orientations. As such, the state of the MTJ is preserved when power to the device is removed. Therefore, a STT memory bit cell composed of the stack 100, 200, 300, or 400, is, in an embodiment, non-volatile.

Various embodiments addressed herein include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes an apparatus comprising: a substrate; a magnetic tunnel junction (MTJ) comprising a fixed layer and first and second free layers between the fixed layer and the substrate; a seed layer directly contacting the second free layer; and a barrier layer between the first and second free layers; wherein (a) the first free layer is non-epitaxial and includes Cobalt (Co), Iron (Fe), and Boron (B), and (b) the second free layer is epitaxial and includes Manganese (Mn) and Gallium (Ga).

For example, the second free layer may include $Mn_2Ru_xGa$ (x=0.2-1.0), $Mn_2Ga$, $Mn_3Ga$, $Mn_{2-x}Ga_x$ and alloys thereof.

In example 2 the subject matter of the Example 1 can optionally include wherein the barrier layer includes at least one of Tantalum (Ta), Tungsten (W), and Chromium (Cr) and the barrier layer directly contacts both of the first and second free layers.

In example 3 the subject matter of the Examples 1-2 can optionally include a dielectric layer directly contacting a top surface of the first free layer, wherein the bottom surface of the first free layer directly contacts the barrier layer.

In example 4 the subject matter of the Examples 1-3 can optionally include wherein the fixed layer includes a sublayer comprising Co and another sublayer comprising Platinum (Pt).

In example 5 the subject matter of the Examples 1-4 can optionally include comprising a bottom electrode between the second free layer and the substrate.

In example 6 the subject matter of the Examples 1-5 can optionally include a cap layer, wherein the fixed layer is between the cap layer and the dielectric layer.

In example 7 the subject matter of the Examples 1-6 can optionally include an additional fixed layer that includes Co, Fe, and B, wherein the additional fixed layer is between the fixed layer and the dielectric layer.

In example 8 the subject matter of the Examples 1-7 can optionally include comprising an additional barrier layer between the fixed layer and the additional fixed layer.

In example 9 the subject matter of the Examples 1-8 can optionally include wherein the second free layer includes Ruthenium (Ru).

In example 10 the subject matter of the Examples 1-9 can optionally include wherein the second free layer includes an alloy that further includes the Mn and the Ga.

In example 11 the subject matter of the Examples 1-10 can optionally include wherein (a) the first free layer includes a thickness from a top surface of the first free layer to a bottom surface of the first free layer, and (b) the MTJ is a perpendicular MTJ based on the thickness.

In example 12 the subject matter of the Examples 1-11 can optionally include wherein the seed layer includes at least one of Titanium (Ti), Nitrogen (N), Chromium (Cr), and Ruthenium (Ru).

Example 13 includes a substrate; and a perpendicular magnetic tunnel junction (pMTJ) comprising a fixed layer and first and second free layers; wherein (a) the first free layer includes Cobalt (Co), Iron (Fe), and Boron (B), and (b) the second free layer is epitaxial and includes Manganese (Mn) and Gallium (Ga).

In example 14 the subject matter of Example 13 can optionally include wherein the first and second free layers are between the fixed layer and the substrate.

In example 15 the subject matter of the Examples 13-14 can optionally include a barrier layer between the first and second free layers, wherein the barrier layer includes at least one of Tantalum (Ta) and Tungsten (W).

In example 16 the subject matter of the Examples 13-15 can optionally include a dielectric layer directly contacting a top surface of the first free layer, wherein the bottom surface of the first free layer directly contacts the barrier layer.

In example 17 the subject matter of the Examples 13-16 can optionally include a bottom electrode between the second free layer and the substrate, wherein the fixed layer includes Co and Platinum (Pt).

In example 18 the subject matter of the Examples 13-17 can optionally include an additional fixed layer that includes Co, Fe, and B, wherein the additional fixed layer is between the fixed layer and the dielectric layer.

In example 19 the subject matter of the Examples 13-18 can optionally include an additional barrier layer between the fixed layer and the additional fixed layer.

Example 20 includes a substrate; a perpendicular spin transfer torque memory (STTM) including a perpendicular magnetic tunnel junction (pMTJ) that comprises a fixed layer and first and second free layers; top and bottom electrodes; and a transistor coupled to one of the top and bottom electrodes, a source line, and a word line; wherein (a) the first free layer includes Cobalt (Co), Iron (Fe), and Boron (B), and (b) the second free layer includes Manganese (Mn) and Gallium (Ga).

In Example 21 the subject matter of the Example 20 can optionally include wherein the first and second free layers are between the fixed layer and the substrate.

In example 22 the subject matter of the Examples 20-21 can optionally include a barrier layer between the first and second free layers, wherein the barrier layer includes at least one of Tantalum (Ta) and Tungsten (W).

In example 23 the subject matter of the Examples 20-22 can optionally include comprising a mobile computing node including a non-volatile memory that comprises the MTJ.

Example 24 includes an apparatus comprising: a substrate; a spin transfer torque memory (STTM) including a magnetic tunnel junction (MTJ) that comprises a fixed layer and first and second free layers; top and bottom electrodes; and a transistor coupled to one of the top and bottom electrodes, a source line, and a word line; wherein (a) the first free layer includes Cobalt (Co), Iron (Fe), and Boron (B), and (b) the second free layer includes Manganese (Mn) and Gallium (Ga).

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
    a substrate;
    a magnetic tunnel junction (MTJ) comprising a fixed layer and first and second free layers between the fixed layer and the substrate;
    a seed layer directly contacting the second free layer; and
    a barrier layer between the first and second free layers;
    wherein (a) the first free layer is non-epitaxial and includes Cobalt (Co), Iron (Fe), and Boron (B), and (b) the second free layer is an epitaxial crystal structure and includes Manganese (Mn) and Gallium (Ga).

2. The apparatus of claim 1, wherein the barrier layer includes at least one of Tantalum (Ta), Tungsten (W), Molybdenum (Mo), Hafnium (Hf), Vanadium (V), Zirconium (Zr), Chromium (Cr), or combinations thereof and the barrier layer directly contacts both of the first and second free layers.

3. The apparatus of claim 2 comprising a dielectric layer directly contacting a top surface of the first free layer, wherein the bottom surface of the first free layer directly contacts the barrier layer.

4. The apparatus of claim 3, wherein the fixed layer includes a sublayer comprising Co and another sublayer comprising Platinum (Pt).

5. The apparatus of claim 4, comprising a bottom electrode between the second free layer and the substrate.

6. The apparatus of claim 5 comprising a cap layer, wherein the fixed layer is between the cap layer and the dielectric layer.

7. The apparatus of claim 6 comprising an additional fixed layer that includes Co, Fe, and B, wherein the additional fixed layer is between the fixed layer and the dielectric layer.

8. The apparatus of claim 7 comprising an additional barrier layer between the fixed layer and the additional fixed layer.

9. The apparatus of claim 2, wherein the second free layer includes Ruthenium (Ru).

10. The apparatus of claim 2, wherein the second free layer includes an alloy that further includes the Mn and the Ga.

11. The apparatus of claim 1, wherein (a) the first free layer includes a thickness from a top surface of the first free layer to a bottom surface of the first free layer, and (b) the MTJ is a perpendicular MTJ based on the thickness.

12. The apparatus of claim 1, wherein the seed layer includes at least one of Titanium (Ti), Nitrogen (N), Chromium (Cr), Ruthenium (Ru), or combinations thereof.

13. An apparatus comprising:
    a substrate;
    a magnetic tunnel junction comprising a fixed layer and first and second free layers; and
    a seed layer directly contacting the second free layer, but not directly contacting the first free layer;
    wherein
    (a) the first free layer includes Cobalt (Co), Iron (Fe), and Boron (B), and
    (b) the second free layer includes Manganese (Mn) and Gallium (Ga);
    wherein the first and second free layers are between the fixed layer and the substrate;
    wherein the seed layer includes at least one of Titanium (Ti), Nitrogen (N), Chromium (Cr), Ruthenium (Ru), or combinations thereof.

14. The apparatus of claim 13 comprising a barrier layer between the first and second free layers, wherein the barrier layer includes Tantalum (Ta).

15. The apparatus of claim 14 comprising a dielectric layer directly contacting a top surface of the first free layer, wherein the bottom surface of the first free layer directly contacts the barrier layer.

16. The apparatus of claim 13, comprising a bottom electrode between the second free layer and the substrate, wherein the fixed layer includes Co and Platinum (Pt).

17. The apparatus of claim 16 comprising an additional fixed layer that includes Co, Fe, and B, wherein the additional fixed layer is between the fixed layer and the dielectric layer.

18. The apparatus of claim 17 comprising an additional barrier layer between the fixed layer and the additional fixed layer.

* * * * *